(12) United States Patent
Chen (10) Patent No.: US 11,703,382 B2
(45) Date of Patent: Jul. 18, 2023

(54) DISPLAY ASSEMBLY AND MANUFACTURING METHOD THEREOF, ELECTRONIC DEVICE

(71) Applicant: BEIJING XIAOMI MOBILE SOFTWARE CO., LTD., Beijing (CN)

(72) Inventor: Chaoxi Chen, Beijing (CN)

(73) Assignee: Beijing Xiaomi Mobile Software Co., Ltd., Beijing (CN)

( * ) Notice: Subject to any disclaimer, the term of this patent is extended or adjusted under 35 U.S.C. 154(b) by 214 days.

(21) Appl. No.: 17/170,867

(22) Filed: Feb. 8, 2021

(65) Prior Publication Data

US 2021/0381886 A1 Dec. 9, 2021

(30) Foreign Application Priority Data

Jun. 5, 2020 (CN) .......................... 202010506775.1

(51) Int. Cl.
*G01J 1/42* (2006.01)
*G01J 1/44* (2006.01)

(52) U.S. Cl.
CPC .............. *G01J 1/4204* (2013.01); *G01J 1/44* (2013.01)

(58) Field of Classification Search
CPC ..... G01J 1/4204; G01J 1/44; G02F 1/133331; G02F 1/13318; G02F 1/133512; G02F 1/13312; G02F 1/1333; G02F 1/133308; H01L 27/3227
See application file for complete search history.

(56) References Cited

U.S. PATENT DOCUMENTS

| | | | | |
|---|---|---|---|---|
| 8,492,695 | B2 * | 7/2013 | Horikoshi | H01L 27/14629 257/432 |
| 9,236,406 | B2 * | 1/2016 | Kuroda | H01L 27/14603 |
| 10,712,595 | B2 * | 7/2020 | Yang | G02F 1/133526 |
| 10,903,288 | B2 * | 1/2021 | Ye | G06V 10/147 |
| 2019/0310724 | A1 | 10/2019 | Yeke Yazdandoost et al. | |

FOREIGN PATENT DOCUMENTS

| | | |
|---|---|---|
| CN | 108258024 A | 7/2018 |
| CN | 108983469 A | 12/2018 |
| CN | 209056218 U | 7/2019 |

OTHER PUBLICATIONS

Extended European Search Report issued in European Application No. 21155787.1 dated Jul. 19, 2021, (8p).
First Office Action issued to Chinese Application No. 202010506775.1 dated Jan. 29, 2022 with English translation, (10p).

* cited by examiner

*Primary Examiner* — Seung C Sohn
(74) *Attorney, Agent, or Firm* — Arch & Lake LLP (57) ABSTRACT

Provided are a display assembly, a method for manufacturing a display assembly and an electronic device. The display assembly includes: a pixel array including a plurality of pixel units; a photosensitive array including a plurality of photosensitive units, at least one of the photosensitive unit is disposed in a gap between two adjacent pixel units of the pixel array for detecting ambient light through the pixel array.

19 Claims, 5 Drawing Sheets

DISPLAY ASSEMBLY AND MANUFACTURING METHOD THEREOF, ELECTRONIC DEVICE

CROSS-REFERENCE TO RELATED APPLICATIONS

This application is based on and claims priority to Chinese Patent Application No. 202010506775.1, filed on Jun. 5, 2020, the entire content of which is incorporated herein by reference for all purposes.

TECHNICAL FIELD

The present disclosure generally relates to the field of electronic technologies, and more particularly to a display assembly, a manufacturing method thereof and an electronic device.

BACKGROUND

With developments of electronic devices such as smart phones and tablet computers, a high screen-to-body ratio has become a popular demand. For example, the screen-to-body ratio may be increased in manners of a full screen, a curved screen and a surround screen. However, the increase in the display screen of the electronic device inevitably reduces the layout space of other components, such as cameras and sensors. Therefore, there are still needs of researches of setting cameras, sensors, etc. in the area where the display screen is located, and reducing the interference of the display screen itself to the components such as cameras and sensors.

SUMMARY

The present disclosure provides a display assembly and a manufacturing method thereof as well as an electronic device.

According to a first aspect of the present disclosure, there is provided a display assembly, the display assembly includes: a pixel array including a plurality of pixel units; a photosensitive array including a plurality of photosensitive units; at least one of the photosensitive units is disposed in a gap between two adjacent pixel units of the pixel array to detect ambient light.

According to a second aspect of the present disclosure, a method for manufacturing a display assembly includes: forming a pixel array comprising a plurality of pixel units; providing a photosensitive unit in a gap between two adjacent pixel units to form a photosensitive array comprising a plurality of photosensitive units.

According to a third aspect of the present disclosure, an electronic device includes a housing; a power supply assembly and a processing assembly located inside the housing; and the display assembly as described above, covering at least one surface of the housing.

It is to be understood that both the foregoing general description and the following detailed description are explanatory only and shall not be construed to limit the present disclosure.

BRIEF DESCRIPTION OF THE DRAWINGS

The accompanying drawings, which are incorporated in and constitute a part of this specification, illustrate embodiments consistent with the present disclosure and, together with the description, serve to explain the principles of the present disclosure.

DETAILED DESCRIPTION

Reference will now be made in detail to embodiments, examples of which are illustrated in the accompanying drawings. The following description refers to the accompanying drawings in which the same numbers in different drawings represent the same or similar elements unless otherwise represented. The implementations set forth in the following description of embodiments do not represent all implementations consistent with the present disclosure. Instead, they are merely examples of apparatuses and methods consistent with aspects related to the present disclosure as recited in the appended claims.

According to a first aspect of the present disclosure, there is provided a display assembly, the display assembly includes: a pixel array including a plurality of pixel units; a photosensitive array including a plurality of photosensitive units; at least one of the photosensitive units is disposed in a gap between two adjacent pixel units of the pixel array to detect ambient light.

In some embodiments, the display assembly also includes: a photosensitive processing circuit distributed below the photosensitive array along the gap between the plurality of pixel units in the pixel array, connected to the photosensitive array, and configured to process a first electric signal obtained through sensing the ambient light by the photosensitive array to obtain a second electric signal.

In some embodiments, the pixel array includes: a first area and a second area, in which a first gap between the adjacent pixel units in the first area is greater than a second gap between the adjacent pixel units in the second area; and the photosensitive array is located in the first gap between the pixel units in the first area.

In some embodiments, the first area is located at one or more edges of the pixel array, and includes: an area where at least two adjacent rows of pixel units are located, or an area where at least two adjacent columns of pixel units are located; the photosensitive array is located in a gap between any two adjacent rows or columns of pixel units in the first area, and a length of the photosensitive array is consistent with a length of the first area.

In some embodiments, a ratio of the gap between the pixel units in the first area to the gap between the pixel units in the second area is in a range of 1.1 to 2.

In some embodiments, the display assembly also includes: a transparent cover plate covering the pixel array and the photosensitive array and having a light transmission direction and a light shielding direction. The light transmission direction is a direction from the transparent cover plate to the photosensitive array, and the light shielding direction is a connection direction of two adjacent pixel units.

In some embodiments, a thickness of the transparent cover plate is less than a thickness threshold. The thickness threshold is a thickness corresponding to a minimum photosensitive angle of the photosensitive array, in which the photosensitive angle of the photosensitive array is an arctangent value of a ratio of half a width of the photosensitive array to the thickness of the transparent cover plate.

In some embodiments, the minimum photosensitive angle is a photosensitive angle when a photosensitive power intensity of the photosensitive array is half of a maximum power intensity.

According to a second aspect of the present disclosure, a method for manufacturing a display assembly includes: forming a pixel array comprising a plurality of pixel units; providing a photosensitive unit in a gap between two adjacent pixel units to form a photosensitive array comprising a plurality of photosensitive units.

In some embodiments, the method also includes: forming a photosensitive processing circuit below the photosensitive array along the gap between the plurality of pixel units in the pixel array; connecting the photosensitive processing circuit with the photosensitive array.

In some embodiments, the method also includes: covering the pixel array and the photosensitive array with a transparent cover plate, in which the transparent cover plate above the photosensitive array has a light transmission direction and a light shielding direction, the light transmission direction is a direction from the transparent cover plate to the photosensitive array, the light shielding direction is a connection direction of two adjacent pixel units.

According to a third aspect of the present disclosure, an electronic device includes a housing; a power supply assembly and a processing assembly located inside the housing; and the display assembly as described above, covering at least one surface of the housing.

In some embodiments, a photosensitive processing circuit distributed below the photosensitive array along the gap between the plurality of pixel units in the pixel array, connected to the photosensitive array, and configured to process a first electric signal obtained through sensing the ambient light by the photosensitive array to obtain a second electric signal.

In some embodiments, the pixel array includes: a first area and a second area. The first area includes a plurality of first pixel units separated by a first gap between adjacent first pixel units. The second area includes a plurality of second pixel units separated by a second gap between adjacent second pixel units. The first gap between the adjacent first pixel units in the first area is greater than the second gap between the adjacent second pixel units in the second area. The photosensitive array is located in the first gap in the first area.

In some embodiments, the first area is located at one or more edges of the pixel array, and comprises an area where at least two adjacent rows of pixel units are located, or an area where at least two adjacent columns of pixel units are located; the photosensitive array is located in a gap between any two adjacent rows or columns of pixel units in the first area, and a length of the photosensitive array is consistent with a length of the first area.

In some embodiments, a ratio of the gap between the pixel units in the first area to the gap between the pixel units in the second area is in a range of 1.1 to 2.

In some embodiments, the electronic device further includes: a transparent cover plate covering the pixel array and the photosensitive array and having a light transmission direction and a light shielding direction; wherein the light transmission direction is a direction from the transparent cover plate to the photosensitive array, and the light shielding direction is a connection direction of two adjacent pixel units.

In some embodiments, a thickness of the transparent cover plate is less than a thickness threshold; the thickness threshold is a thickness corresponding to a minimum photosensitive angle of the photosensitive array, in which the photosensitive angle of the photosensitive array is an arctangent value of a ratio of half a width of the photosensitive array to the thickness of the transparent cover plate.

In some embodiments, the minimum photosensitive angle is a photosensitive angle when a photosensitive power intensity of the photosensitive array is half of a maximum power intensity.

The technical solutions provided by the embodiments of the present disclosure may include the following advantageous effects. With the technical solutions of the embodiments of the present disclosure, the photosensitive array formed by the photosensitive units is disposed in the gap of the pixel array of the display screen, such that the photosensitive unit may directly detect the ambient light emitted from the outside of the display screen. Moreover, since the photosensitive array is disposed in the gap of among the pixel units, compared with the photosensitive sensor disposed below the screen, the interference of the light emission of the pixel unit to the photosensitive unit may be reduced, thereby improving the accuracy of detection. At the same time, compared with arrangements of providing the photosensitive array in a frame area of the display screen or a frame area of the electronic device which is even outside the display screen, the arrangement of the present disclosure will not reduce the size of the display area, which is beneficial to the design of the full screen. Moreover, the photosensitive array may be disposed in any position of the gap of the pixel array, and thus a larger area of the display screen may be used as the photosensitive area of the photosensitive array to improve the photosensitive efficiency.

Figure 1:
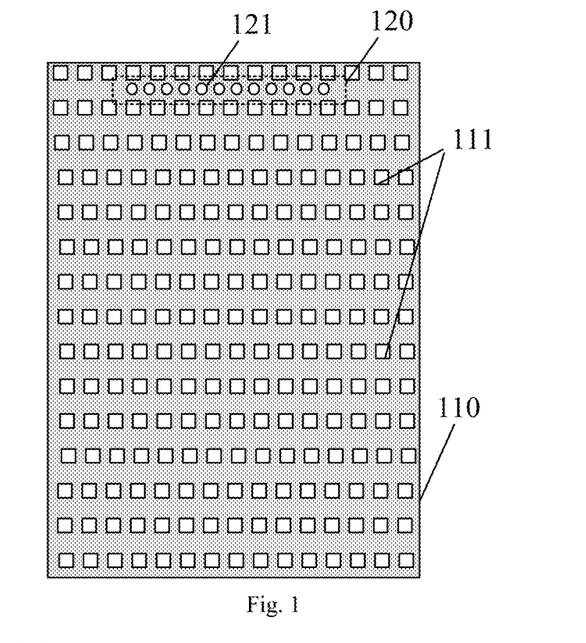
FIG. 1 is a schematic view 1 illustrating a display assembly according to one or more examples.

FIG. 1 is a schematic view illustrating a display assembly according to one or more examples. Referring to FIG. 1, the display assembly 100 includes: a pixel array 110 including a plurality of pixel units 111; a photosensitive array 120 including a plurality of photosensitive units 121; at least one of the photosensitive units 121 is disposed in a gap between two adjacent pixel units 111 of the pixel array 110 to detect ambient light which passes through the pixel array. For example, as shown in FIG. 1, some photosensitive units 121 are inserted between two adjacent rows of pixel units 111 of the pixel array 110, to form the photosensitive array 120 disposed in the gap of the pixel array 110.

In embodiments of the present disclosure, the display assembly may be used for a display function of various electronic devices, such as LCD (liquid crystal display) and OLED (organic light emitting diode) display screens. The display assembly may emit light from each position of the pixel units in the pixel array with different intensity to outside of the display assembly to realize image display.

In the embodiments of the present disclosure, the photosensitive array including a plurality of photosensitive units is configured to detect ambient light. The photosensitive unit may include a photosensitive sensor, a photodiode, or other type of sensor that is configured to convert a received light signal into an electric signal, such that the light intensity may be detected according to the intensity of the electric signal.

Since the display assembly is a light emitting assembly, it is desired to reduce the influence of the light emitting of the display assembly itself during the detection process of the photosensitive unit. In the embodiment of the present disclosure, the photosensitive array is disposed in the gap of the pixel units. In this way, the pixel unit and the photosensitive array are disposed at the same height level where the pixel units emit light to the outside of the display assembly, and the photosensitive array receives light to the inside of the display assembly. Therefore, the photosensitive unit may receive less or no light emitted by the pixel unit, and thus the detection accuracy may be improved.

An area of a single photosensitive unit may be less than or equal to an area of the pixel unit, in this way, the photosensitive unit is disposed or positioned in the gap of the pixel unit, which is not easily perceived by human vision and reduces the influence on the display effect. At the same time, since the photosensitive array is composed of a plurality of photosensitive units, the total photosensitive area is larger, thus having a higher detection efficiency. For example, for an LCD, light is emitted by a backlight module toward the pixel unit, and inclination (i.e., a pretilt angle) of the liquid crystal is adjusted by an electric field of the pixel unit, to realize brightness adjustment of a position where the pixel unit is located, thereby realizing the display function. In the gap between adjacent pixel units of the LCD, there are black light-shielding matrices and metal traces for isolating pixels. The light emitted by the LCD backlight module may be shielded by the gap positions of the pixel units, such that the above-mentioned photosensitive array may be arranged at these positions. In this way, the light emitted by the backlight module will not be received by the photosensitive array, thereby reducing the influence of the light emitted by the display assembly itself on the ambient light detection.

For an OLED, the pixel unit is composed of organic light emitting diodes, which has a self-luminous ability, and thus OLED does not need a backlight module. The photosensitive units may also be distributed in the gaps of the pixel units to detect the ambient light emitted from the outside and toward the display assembly. The pixel unit emits light toward the outside of the display assembly, such that the interference of the light emission of the pixel unit on the photosensitive unit may be reduced as possible.

In the embodiments of the present disclosure, the photosensitive units are concentrated in an area to form a continuous photosensitive array; or several sets of consecutive photosensitive arrays are formed in different areas at different positions of the display assembly (such as an area near the upper or lower border of the display assembly). In this way, a larger light sensing area may be obtained to improve the sensitivity of light sensing and the detection efficiency. For example, the photosensitive units are distributed in the gap between two rows of display pixels to form a photosensitive array. It is also possible to arrange the photosensitive units in different gaps between adjacent pixel units, such that the photosensitive array is distributed among the pixel array. In this way, the pixel units and the photosensitive units in the display assembly may be arranged alternately and uniformly, thereby increasing the total photosensitive area of the photosensitive array and reducing the influence of the photosensitive units on the display effect of the pixel array.

With the above-mentioned solutions according to the embodiments of the present disclosure, at least one of the photosensitive units is inserted between adjacent pixel units of the pixel array, such that the pixel unit and the photosensitive unit are located within the same height level. In this way, compared with disposing the photosensitive array below the display assembly as a whole, the influence of the display assembly itself on the detection of the ambient light may be reduced, and the accuracy of the detection may be improved; at the same time, it is also beneficial to increase the photosensitive area of the photosensitive array to improve the detection efficiency.

In some embodiments, the display assembly also includes: a photosensitive processing circuit distributed below the photosensitive array along the gap between the plurality of pixel units in the pixel array, connected to the photosensitive array, and configured to process a first electric signal obtained through sensing the ambient light by the photosensitive array to obtain a second electric signal.

It should be understood that the electric signal generated by light sensing is relatively weak, and if it is transmitted to the processing circuit through a long-distance wire, a large signal loss will occur, thus hardly detecting an accurate electric signal. Therefore, in the embodiment of the present disclosure, the photosensitive processing circuit is also arranged in the gap of the pixel unit, and stacked below the photosensitive array, and directly connected to the photosensitive array. In this way, the first electric signal obtained by the photosensitive array according to the light signal convection may be directly transmitted to the photosensitive processing circuit, followed by being processed to obtain the second electric signal. In this way, the signal loss caused by wire transmission may be reduced to improve the detection accuracy.

In one or more embodiments, the photosensitive processing circuit at least includes: a signal amplifier for amplifying the first electric signal to obtain the second electric signal. In this way, the relatively weak first electric signal detected by the photosensitive array may be amplified to obtain the second electric signal that is suitable for transmission and processing. The second electric signal may be transmitted to an external processing chip or processor through wires distributed at the display assembly, and then processed by the processing chip or processor to obtain ambient light brightness data.

In another embodiment, the photosensitive processing circuit includes: a signal operation circuit for converting the first electric signal into a second electric signal corresponding to a data value of a photosensitive intensity. For example, an analog to digital conversion circuit is used to convert the first electric signal into the second electric signal corresponding to the level value. In this way, the second electric signal is transmitted to the external processing chip or processor through the wires distributed at the display assembly. The processing chip or processor may directly determine the corresponding brightness level according to the received value, thereby acquiring detected ambient light brightness data.

Figure 2:
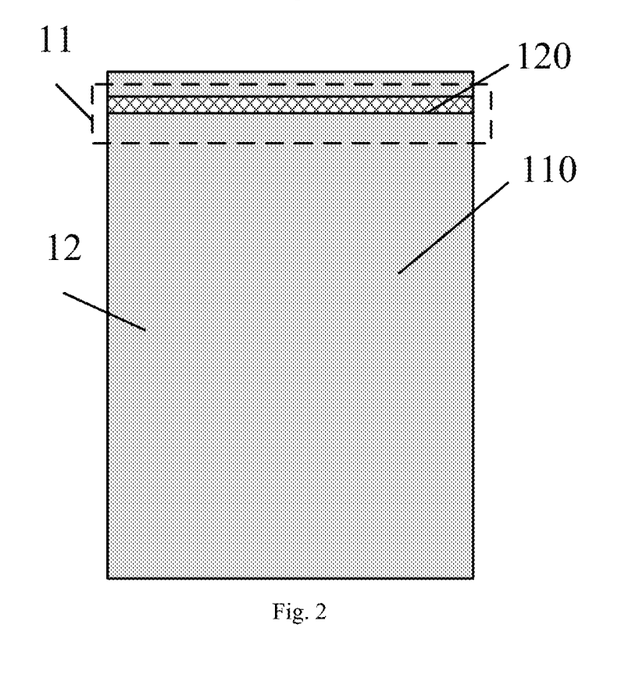
FIG. 2 is a schematic view 2 illustrating a display assembly according to one or more examples.

In some embodiments, referring to FIG. 2, the pixel array 110 includes: a first area 11 and a second area 12, in which a gap between the pixel units in the first area 11 is greater than a gap between the pixel units in the second area 12; and the photosensitive array 120 is located in the gap between the pixel units in the first area 11.

In the embodiments of the present disclosure, the gaps between adjacent pixel units in different areas of the pixel array may be different. The photosensitive array is arranged in the first area with a large pixel unit gap, such that the photosensitive array have enough accommodating space, thereby increasing the photosensitive area of the photosensitive array to improve the detection effect.

For example, the first area includes: two adjacent rows of pixel units, and the gap between the two rows of pixel units is larger than the gap between any other two adjacent rows of pixel units. In this way, the photosensitive array may be inserted between the two rows of pixel units in the first area.

In some embodiments of the present disclosure, a ratio of the gap between the pixel units in the first area to the gap between the pixel units in the second area is in a range of 1.1 to 2.

It should be understood that sizes of each pixel unit and the gap are difficult to be perceived with the human vision. For example, the ratio of an interval (i.e., the gap) between two adjacent pixel units in the first area to an interval (i.e., the gap) between two adjacent pixel units in the second area is in a range of 1.3 to 1.5.

The above-mentioned gap between the pixel units in the first area or the second area may also be determined according to the resolution requirement of the display assembly and the size of the photosensitive unit device. For example, for a display assembly with a high resolution, the gap between the pixel units in the second area is small, thus hardly disposing the photosensitive array. Therefore, the gap between the pixel units in the first area is greater than the gap between the pixel units in the second area. For example, the interval between two adjacent pixel units in the first area is twice the interval between two adjacent pixel units in the second area. Since the resolution of the display assembly is high, and the gap between the pixel units is small, even if the pixel interval in the first area reaches twice, it is still not easy to be perceived by human vision.

If the resolution of the display assembly is low, the interval of the pixel unit is large, and there is a large space to accommodate the photosensitive array. Therefore, the ratio of the interval of the pixel units in the first area to the interval of the pixel units in the second area of 1.1 to 1.3 is enough to arrange the photosensitive array. Meanwhile, since the interval is not increased too much, it is not easy to be perceived by the human vision, thus reducing the influence on the display effect.

In this way, a partial area of the display assembly may be used to arrange the photosensitive array with a sufficient area, such that it has a better photosensitive effect compared with a photosensitive sensor disposed outside the display assembly or a photosensitive chip disposed below the screen.

In some embodiments, the first area is located at one or more edges of the pixel array, and includes an area where at least two adjacent rows of pixel units are located, or an area where at least two adjacent columns of pixel units are located; the photosensitive array is located in a gap between any two adjacent rows or columns of pixel units in the first area, and the length of the photosensitive array is consistent with the length of the first area.

In the embodiment of the present disclosure, the above-mentioned first area may be an area close to the edge of the display assembly, that is, one or more edges of the above-mentioned pixel array. For example, the first n rows of pixel units at the top of the pixel array belong to the first area, the gap between the pixel units in the first area is x, and the pixel units from the $(n+1)^{th}$ row to the last row belong to the second area, the gap between the pixel units in the second area is y, then x is greater than y. A photosensitive array is arranged in the gap with a width x in the first area.

In the embodiment of the present disclosure, the length of the photosensitive array is consistent with the length of the first area, that is, the area where the pixel units with the widened gap is fully utilized. In this way, the widened gap in a whole row or column of the pixel units is convenient for design and manufacture, and at the same time may facilitate the layout of the internal wiring. Meanwhile, since the first area is located at the edge area of the pixel array, the influence on resolution of the display image may be reduced, and a better display effect may be achieved on the basis of providing sufficient photosensitive area for the photosensitive array.

In some embodiments, the display assembly also includes: a transparent cover plate covering the pixel array and the photosensitive array and having a light transmission direction and a light shielding direction. The light transmission direction is a direction from the transparent cover plate to the photosensitive array, and the light shielding direction is a connection direction of two adjacent pixel units.

In the embodiments of the present disclosure, the transparent cover plate is used as a protective layer above the pixel array and the photosensitive array of the display assembly. The transparent cover plate is made of a light-transmitting material, such as a glass cover plate made of glass or a plastic cover plate made of transparent plastic. A light guide direction of the transparent cover plate is perpendicular to the display surface of the display assembly, that is, the light may propagate in the direction from inner side to outer side or from outer side to inter side of the transparent cover plate, but not in the direction parallel to the display assembly. In this way, the photosensitive array may receive the ambient light emitted from the outside of the transparent cover plate to the inside of the display assembly along the light transmission direction of the transparent cover plate, thereby receiving less light in the shielding direction, that is, in the direction parallel to the display surface of the display assembly. Therefore, the interference happened in the case where the light enters in the photosensitive array due to multiple reflections of the light in the transparent cover is reduced.

In one embodiment, the transparent cover plate is made of a transparent material with directional light-guiding properties. For example, a glass cover plate has a light-guiding hole in a direction perpendicular to the display surface.

In some embodiments, a thickness of the transparent cover is less than a thickness threshold. The thickness threshold is a thickness corresponding to a minimum photosensitive angle of the photosensitive array, and the photosensitive angle of the photosensitive array is an arctangent value of a ratio of half a width of the photosensitive array to the thickness of the transparent cover plate.

Since the refraction phenomenon of the light may occur in the transparent cover plate, there will be an energy lose when the ambient light enters the photosensitive array. Therefore, in the embodiment of the present disclosure, the thickness of the transparent cover plate is determined according to the photosensitive angle of the photosensitive array. For example, if the photosensitive angle is greater than 35°, and the width of the photosensitive array or photosensitive unit is w, then the thickness h of the transparent cover plate satisfies arctan(w/2 h>35°).

In this way, the ambient light intensity may be less weakened by the transparent cover plate, such that more light enters the photosensitive array, thus improving the detection efficiency of the photosensitive array.

In some embodiments, the minimum photosensitive angle is a photosensitive angle when a photosensitive power intensity of the photosensitive array is half of a maximum power intensity.

It could be understood that the intensity of the photosensitive power of the photosensitive array represents the quantity of the light sensed by the photosensitive array. Within sensing surface of the photosensitive array or photosensitive unit, the light which has a direction closer to the direction perpendicular to the photosensitive surface has a greater photosensitive power intensity, and the light which has a direction closer to the direction parallel to the photosensitive surface has a smaller photosensitive power intensity. That is, within the photosensitive view of the photosensitive array, the angle is small, but the photosensitive intensity is high.

Therefore, in the embodiment of the present disclosure, the photosensitive angle corresponding to half of the maximum power intensity is used as the minimum photosensitive angle. In this way, during determining the thickness of the transparent cover plate, the photosensitive angle is not less than the angle corresponding to half of the maximum power intensity, such that a part with higher light power may be used as the photosensitive angle, and at least the light within the minimum photosensitive angle is able to enter the photosensitive array. In practical applications, the minimum photosensitive angle may also be determined according to practical needs.

In one embodiment, the above-mentioned photosensitive array may include the photosensitive units with multiple photosensitive wavelengths, which are arranged alternately. For example, filter films of different colors (such as RGBC, red, green, blue and full-wave bands) are coated on the photodiode to form the photosensitive units with different wavelengths. In this way, data processing and analyzing may be improved, and at the same time, it is easy to filter out the light signals in the bands which may cause signal interference.

Figure 3:
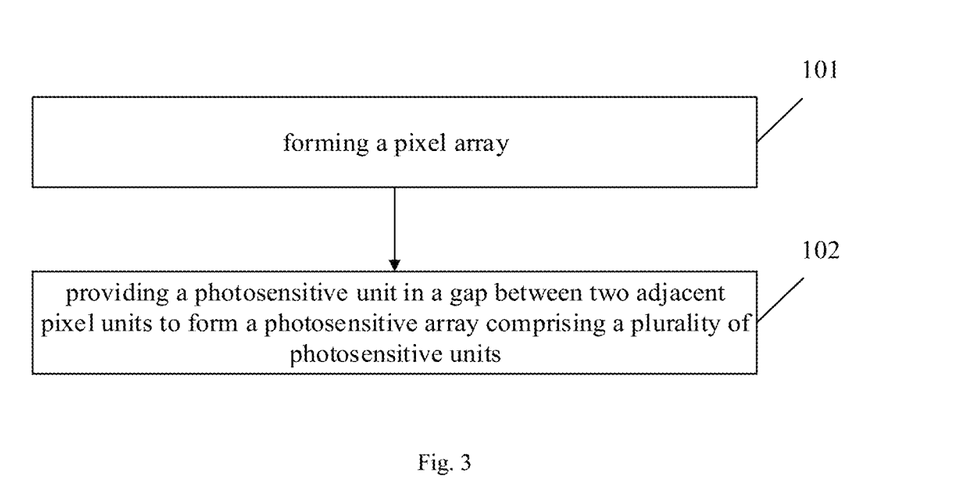
FIG. 3 is a flow chart of a method for manufacturing a display assembly according to one or more examples.

Referring to FIG. 3, the embodiments of the present disclosure provide a method for manufacturing a display assembly, and the method includes: in block 101, forming a pixel array including a plurality of pixel units; in block 102, providing a photosensitive unit in a gap between two adjacent pixel units to form a photosensitive array including a plurality of photosensitive units.

In the embodiment of the present disclosure, during the manufacture of the display assembly, the process of forming the pixel array may include coating a film layer of different material on a substrate to form the pixel units. For example, an organic light emitting material may be coated to form an organic light emitting diode, and a metal material may be coated to form wires to connect the OLED with a peripheral circuit. In practical applications, the process of forming the pixel array may include coating, chemical or physical vapor deposition to form the film, forming a patterned film layer by photolithography, and forming a final pixel array by stacking a plurality of patterned film layers.

After the pixel array is formed, the display assembly has the basic components of the display function. In the embodiments of the present disclosure, the photosensitive units are disposed in the gap of at least some of the pixel units to form the above-mentioned photosensitive array. The way of forming the photosensitive array may be similar to the way of forming the pixel array. In practical applications, the positions and graphics of the pixel array and the photosensitive array are designed in advance to form a complete layout. Therefore, during the manufacturing process, the order of the formation of the layers may be adjusted according to practical needs. For example, the pixel array may be formed first and then the photosensitive array is formed, and vice versa. For another example, the organic light emitting material may be coated and photo-etched first on the substrate to form the basic elements of OLED, and the photosensitive material may be coated to form the basic photosensitive element; then, multiple layers of conductive materials such as metals are used to form control circuits and wires of the photosensitive element and the light-emitting diode, which may be connected to the external circuit. It is also possible to use the conductive material to form a circuit first, and then the OLED and the photosensitive element are formed on the film layer where the circuit is. In conclusion, the sequence of the operations of the specific production process may be adjusted according to practical needs.

In some embodiments, the method also includes: forming a photosensitive processing circuit below the photosensitive array along the gap between the plurality of pixel units in the pixel array; and connecting the photosensitive processing circuit with the photosensitive array.

In the embodiment of the present disclosure, the photosensitive processing circuit is formed below the photosensitive array to process an electric signal converted from the light signal by the photosensitive array. The photosensitive array converts the light signal into the electric signal through the photodiode, and the electric signal obtained is relatively weak. Therefore, if it is transmitted over a long distance, most of the signal energy will be lost, resulting in a very week signal strength of the signal finally detected or even failure in detecting the signal.

Therefore, in the embodiments of the present disclosure, the photosensitive processing circuit is directly formed below the photosensitive array and connected to the photosensitive array. In this way, the electric signal detected by the photosensitive array may directly reach the photosensitive processing circuit within a short distance, thereby reducing the signal energy loss caused by the transmission of the wire, thus improving the accuracy of detection.

The above-mentioned photosensitive processing circuit at least includes: a signal amplifying component configured to amplify the first light signal detected by the photosensitive array to obtain a second light signal, and transmit the second light signal to an external circuit or chip. Since the second light signal is an amplified signal, original waveform of this signal may be maintained after a long distance transmission, which is suitable for subsequent signal detection and analysis processing.

In the manufacturing process, the photosensitive processing circuit may be formed on the substrate before the photosensitive array is formed, and then the photosensitive array may be formed by the processes such as film forming and photolithography described in the above-mentioned embodiments, such that the photosensitive array may be the upper layer on the photosensitive processing circuit. In this way, the photosensitive processing circuit neither occupies the photosensitive area of the photosensitive array, nor occupies the display area of the pixel array. If the gap of the pixel array is large and the photosensitive area of the photosensitive array is sufficient, it is also possible to form the photosensitive processing circuit beside the photosensitive array.

In some embodiments, the method also includes: covering the pixel array and the photosensitive array with a transparent cover plate; in which the transparent cover plate above the photosensitive array has a light transmission direction and a light shielding direction, the light transmission direction is a direction from the transparent cover plate to the photosensitive array, the light shielding direction is a connection direction of two adjacent pixel units.

In the embodiments of the present disclosure, after the pixel array and the photosensitive array are completed, basic display and ambient light detection functions may be realized. However, since the components on the display assembly are exposed in the air, they are easily damaged and cannot be used normally. Therefore, the pixel array and the photosensitive array may be covered with the transparent cover plate for protecting the components.

Figure 4:
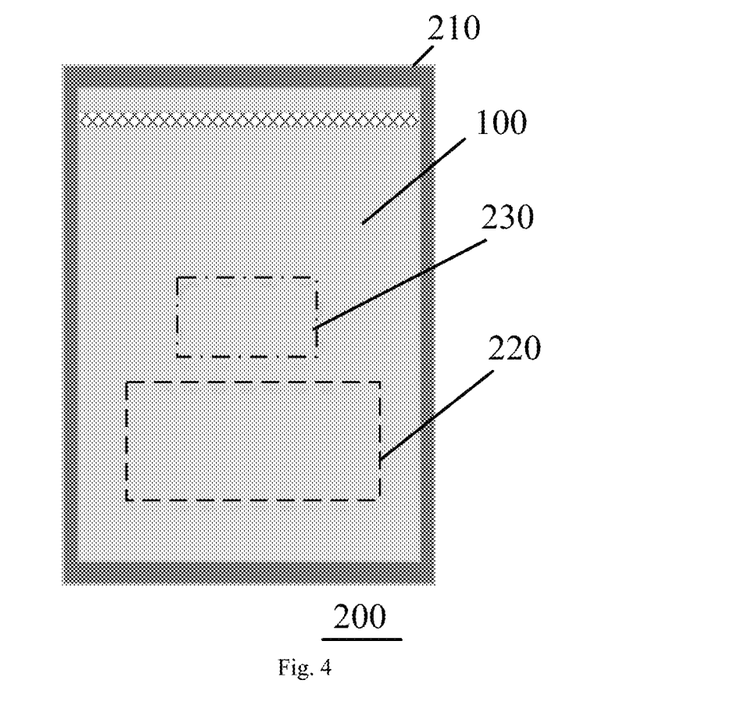
FIG. 4 is a schematic view 1 illustrating an electronic device according to one or more examples.

Referring to FIG. 4, an embodiment of the present disclosure further provides an electronic device 200, including a housing 210; a power supply assembly 220 and a processing assembly 230 located inside the housing 210; and the display assembly 100 as described above, which covers at least one surface of the housing 210.

In the embodiments of the present disclosure, the above-mentioned electronic device may be any device with a display function, and at the same time, the electronic device also needs to detect ambient light. For example, the electronic device may be a mobile phone, a tablet computer, a smart wearable device or any electronic device having different modes, such as a night mode and a day mode, which are distinguished according to brightness of the ambient light.

Embodiments are made to describe the present disclosure as follows.

In the embodiments of the present disclosure, in order to realize ambient light detection in the area where the display screen is located, a slot of x micrometers wide is formed in the pixel area inside the display screen, which is used to arrange an integrated circuit for the ambient light detection.

The photodiode array is arranged in the slot between the pixels in the LCD or OLED display screen, such a slot may not be provided with the pixel units and the driving circuit of the pixel.

Figure 5:
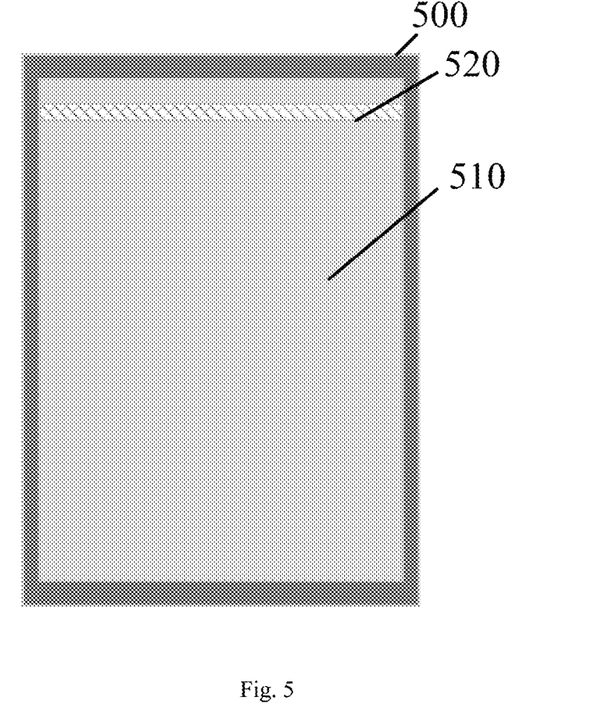
FIG. 5 is a schematic view 2 illustrating an electronic device according to one or more examples.

As shown in the electronic device 500 of FIG. 5, in the area of the pixel array 510 of the display screen, a photosensitive area 520 having a length L and a width W is provided, and no pixel unit is provided in this area 520. The photodiode (PD) array is disposed in the photosensitive area 520 to form the photosensitive area with a length L and a width W. In addition, the photosensitive processing circuit may be disposed at the photosensitive area 520, below the PD array, and connected to the PD array. In this way, the electric signal converted from the light signal by the PD array may be directly processed, for example be amplified, then transmitted to a processor or register, and finally read by a processing chip, thus calculating a light intensity value.

The outermost layer of the display screen is a transparent cover plate made of glass or plastic. The transparent cover plate above the PD array may only allow the light transmission in the direction perpendicular to the display surface of the display screen, but not allow the light transmission in the direction parallel to the display surface. In this way, laterally transmitted light formed by reflections of the ambient light and the light emitting by the pixel inside the transparent cover plate may be shielded, such that most of the light received by the PD array comes from the ambient light, that is, the interference of the reflected light and the light emitting by the pixel on the PD array is reduced.

Figure 6A:
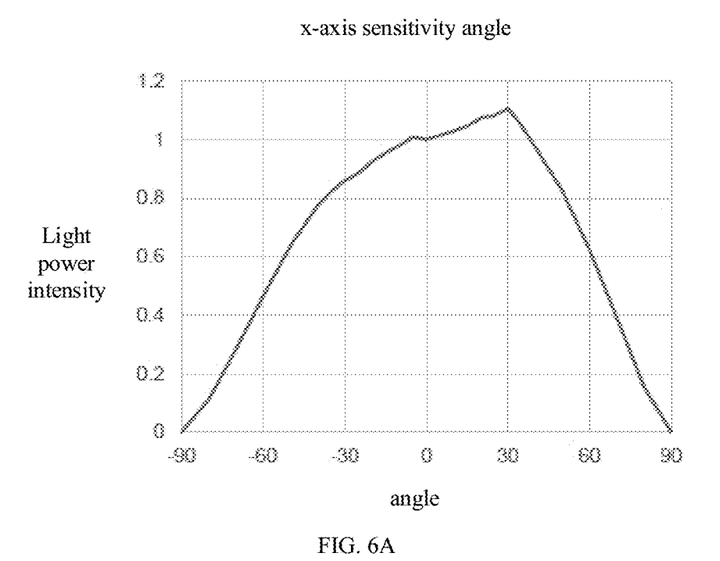
FIG. 6A is a schematic view illustrating a view angle of photosensitive unit at x-axis according to one or more examples.
Figure 6B:
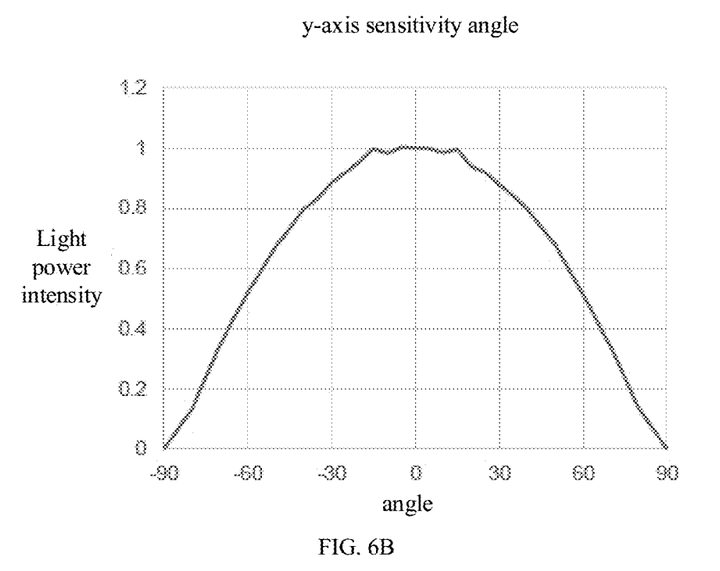
FIG. 6B is a schematic view illustrating a view angle of photosensitive unit at y-axis according to one or more examples.

Since the photosensitive unit (photodiode) in the PD array needs a sufficient photosensitive view angle to perform relatively accurate detection, in the embodiment of the present disclosure, a transparent cover plate is required to meet the requirement of a thickness h. The thickness h is determined by the photosensitive angle of the photosensitive unit. For example, FIG. 6A shows a photosensitive intensity of the photosensitive unit in the plane of the photosensitive surface at x-axis. FIG. 6B shows a photosensitive intensity of the photosensitive unit in the plane of the photosensitive surface at y-axis, where x-axis and y-axis are mutually perpendicular to each other. A point of about 35° is half of the maximum optical power, and thus 35° may be determined as the angle of the half power. The thickness of the transparent cover plate needs to satisfy that the photosensitive angle of the photosensitive unit is greater than the angle of the half power, i.e., arctan(w/2 h) should be greater than 35°. In other words, the thickness h of the transparent cover plate needs to be less than a thickness corresponding to 35°. In this way, it is possible to make the photosensitive unit have a sufficient photosensitive angle to effectively detect the brightness of the ambient light.

In addition, the PD array may include photosensitive arrays with different colors formed by filter films with different wavelengths, to realize the detection of different spectra and facilitate the calculation of color temperature and light intensity.

Regarding the device in the above-mentioned embodiments, the specific manners in which each element performs operations have been described in detail in the embodiments of the method, and thus will not be described here again.

Figure 7:
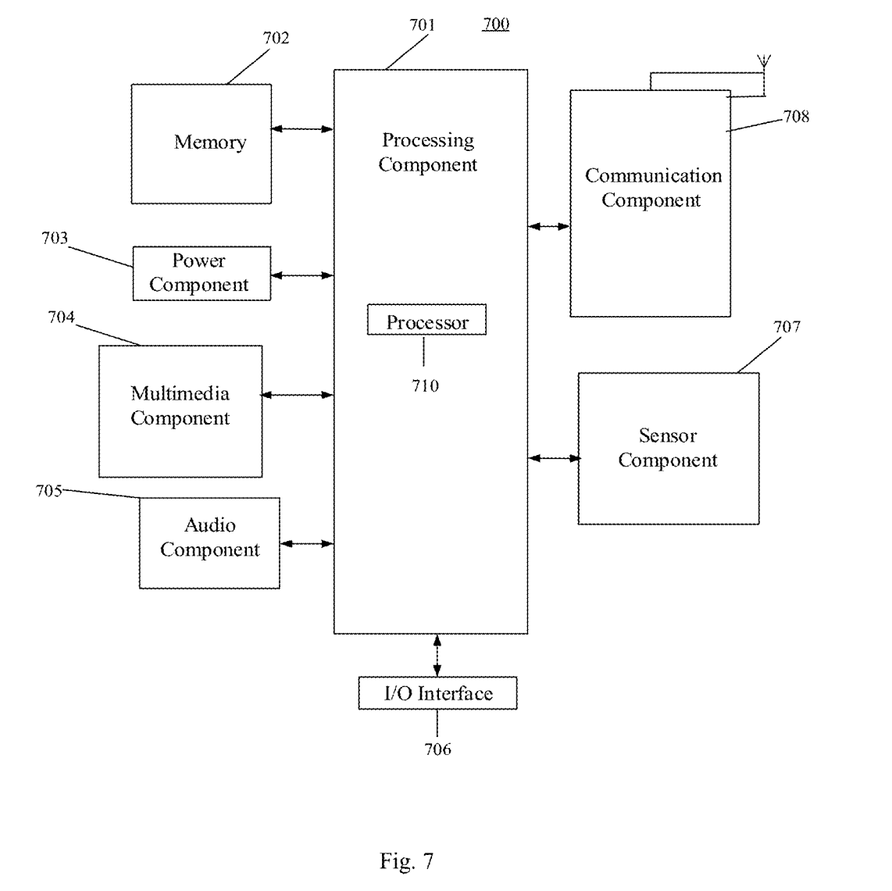
FIG. 7 is a block diagram of an electronic device according to one or more examples.

FIG. 7 is a block diagram showing an electronic device 700 according to one or more examples. For example, the electronic device 700 may be a mobile phone, a computer, a digital broadcasting terminal, a messaging device, a game console, a tablet device, a medical device, exercise equipment, a personal digital assistant, and the like.

Referring to FIG. 7, the device 700 may include one or more of the following components: a processing component 701, a memory 702, a power component 703, a multimedia component 704, an audio component 705, an input/output (I/O) interface 706, a sensor component 707, and a communication component 708.

The processing component 701 typically controls overall operations of the device 700, such as the operations associated with display, telephone calls, data communications, camera operations, and recording operations. The processing component 701 may include one or more processors 710 to execute instructions to perform all or part of the steps in the above described methods. Moreover, the processing component 701 may include one or more modules which facilitate the interaction between the processing component 701 and other components. For instance, the processing component 701 may include a multimedia module to facilitate the interaction between the multimedia component 704 and the processing component 701.

The memory 702 is configured to store various types of data to support the operation of the device 700. Examples of such data include instructions for any applications or methods operated on the device 700, contact data, phonebook data, messages, pictures, video, etc. The memory 702 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 703 provides power to various components of the device 700. The power component 703 may include a power management system, one or more power sources, and any other components associated with the generation, management, and distribution of power in the device 700.

The multimedia component 704 includes a screen providing an output interface between the device 700 and the user. In some embodiments, the screen may include a liquid crystal display (LCD) and a touch panel (TP). If the screen includes the touch panel, the screen may be implemented as a touch screen to receive input signals from the user. The touch panel includes one or more touch sensors to sense touches, swipes, and gestures on the touch panel. The touch sensors may not only sense a boundary of a touch or swipe action, but also sense a period of time and a pressure associated with the touch or swipe action. In some embodiments, the multimedia component 704 includes a front camera and/or a rear camera. The front camera and the rear camera may receive an external multimedia datum while the device 700 is in an operation mode, such as a photographing mode or a video mode. Each of the front camera and the rear camera may be a fixed optical lens system or have focus and optical zoom capability.

The audio component 705 is configured to output and/or input audio signals. For example, the audio component 705 includes a microphone ("MIC") configured to receive an external audio signal when the device 700 is in an operation mode, such as a call mode, a recording mode, and a voice recognition mode. The received audio signal may be further stored in the memory 702 or transmitted via the communication component 708. In some embodiments, the audio component 705 further includes a speaker to output audio signals.

The I/O interface 706 provides an interface between the processing component 701 and peripheral interface modules, such as a keyboard, a click wheel, buttons, and the like. The buttons may include, but are not limited to, a home button, a volume button, a starting button, and a locking button.

The sensor component 707 includes one or more sensors to provide status assessments of various aspects of the device 700. For instance, the sensor component 707 may detect an open/closed status of the device 700, relative positioning of components, e.g., the display and the keypad, of the device 700, a change in position of the device 700 or a component of the device 700, a presence or absence of user contact with the device 700, an orientation or an acceleration/deceleration of the device 700, and a change in temperature of the device 700. The sensor component 707 may include a proximity sensor configured to detect the presence of nearby objects without any physical contact. The sensor component 707 may also include a light sensor, such as a CMOS or CCD image sensor, for use in imaging applications. In some embodiments, the sensor component 707 may also include an accelerometer sensor, a gyroscope sensor, a magnetic sensor, a pressure sensor, or a temperature sensor.

The communication component 708 is configured to facilitate communication, wired or wirelessly, between the device 700 and other devices. The device 700 can access a wireless network based on a communication standard, such as WiFi, 2G, or 3G, or a combination thereof. In one embodiment, the communication component 708 receives a broadcast signal or broadcast associated information from an external broadcast management system via a broadcast channel. In one embodiment, the communication component 708 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In embodiments, the device 700 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components, for performing the above described methods.

In embodiments, there is also provided a non-transitory computer-readable storage medium including instructions, such as included in the memory 702, executable by the processor 710 in the device 700, for performing the above-described methods. For example, the non-transitory computer-readable storage medium may be a ROM, a RAM, a CD-ROM, a magnetic tape, a floppy disc, an optical data storage device, and the like.

The example of the present disclosure also provides a non-transitory computer-readable storage medium, when the instructions in the storage medium are executed by a processor of the mobile terminal, such that the mobile terminal can execute the method provided in any of the foregoing embodiments.

Other embodiments of the present disclosure will be apparent to those skilled in the art from consideration of the specification and practice of the present disclosure disclosed here. This application is intended to cover any variations, uses, or adaptations of the present disclosure following the general principles thereof and including such departures from the present disclosure as come within known or customary practice in the art. It is intended that the specification and examples be considered as exemplary only, with a true scope and spirit of the present disclosure being indicated by the following claims.

It will be appreciated that the present disclosure is not limited to the exact construction that has been described above and illustrated in the accompanying drawings, and that various modifications and changes can be made without departing from the scope thereof. It is intended that the scope of the present disclosure only be limited by the appended claims.

What is claimed is:

1. A display assembly, comprising:
   a pixel array comprising a plurality of pixel units;
   a photosensitive array comprising a plurality of photosensitive units;
   wherein at least one of the photosensitive units is disposed in a gap between two adjacent pixel units of the pixel array to detect ambient light, and the plurality of pixel units and the photosensitive array are disposed at a same height level.

2. The display assembly according to claim 1, further comprising:
   a photosensitive processing circuit distributed below the photosensitive array along the gap between the plurality of pixel units in the pixel array, connected to the photosensitive array, and configured to process a first electric signal obtained through sensing the ambient light by the photosensitive array to obtain a second electric signal.

3. The display assembly according to claim 1, wherein the pixel array comprises:
   a first area including a plurality of first pixel units separated by a first gap between adjacent first pixel units; and a second area including a plurality of second pixel units separated by a second gap between adjacent second pixel units, wherein the first gap between the adjacent first pixel units in the first area is greater than the second gap between the adjacent second pixel units in the second area; and wherein the photosensitive array is located in the first gap in the first area.

4. The display assembly according to claim 3, wherein the first area is located at one or more edges of the pixel array, and comprises an area where at least two adjacent rows of pixel units are located, or an area where at least two adjacent columns of pixel units are located;

wherein the photosensitive array is located between any two adjacent rows or columns of pixel units in the first area, and a length of the photosensitive array is consistent with a length of the first area.

5. The display assembly according to claim 3, wherein a ratio of the first gap in the first area to the second gap in the second area is in a range of 1.1 to 2.

6. The display assembly according to 1, further comprising:

a transparent cover plate covering the pixel array and the photosensitive array and having a light transmission direction and a light shielding direction;

wherein the light transmission direction is pointed from the transparent cover plate to the photosensitive array, and the light shielding direction is along a connection direction of two adjacent pixel units.

7. The display assembly according to claim 6, wherein a thickness of the transparent cover plate is less than a thickness threshold;

wherein the thickness threshold is a thickness corresponding to a minimum photosensitive angle of the photosensitive array, wherein the photosensitive angle of the photosensitive array is an arctangent value of a ratio of half a width of the photosensitive array to the thickness of the transparent cover plate.

8. The display assembly according to claim 7, wherein the minimum photosensitive angle is a photosensitive angle when a photosensitive power intensity of the photosensitive array is half of a maximum power intensity.

9. A method for manufacturing a display assembly, comprising:

forming a pixel array comprising a plurality of pixel units;

providing a photosensitive unit in a gap between two adjacent pixel units to form a photosensitive array comprising a plurality of photosensitive units;

wherein the plurality of pixel units and the photosensitive array are disposed at a same height level.

10. The method according to claim 9, further comprising:

forming a photosensitive processing circuit below the photosensitive array along the gap between the plurality of pixel units in the pixel array;

connecting the photosensitive processing circuit with the photosensitive array.

11. The method according to claim 9, further comprising:

covering the pixel array and the photosensitive array with a transparent cover plate;

wherein the transparent cover plate above the photosensitive array has a light transmission direction and a light shielding direction, the light transmission direction is a direction from the transparent cover plate to the photosensitive array, the light shielding direction is a connection direction of two adjacent pixel units.

12. An electronic device, comprising:

a housing;

a power supply assembly and a processing assembly located inside the housing; and a display assembly covering at least one surface of the housing, wherein the display assembly comprises:

a pixel array comprising a plurality of pixel units;

a photosensitive array comprising a plurality of photosensitive units;

wherein at least one of the photosensitive units is disposed in a gap between two adjacent pixel units of the pixel array to detect ambient light, and the plurality of pixel units and the photosensitive array are disposed at a same height level.

13. The electronic device according to claim 12, further comprising:

a photosensitive processing circuit distributed below the photosensitive array along the gap between the plurality of pixel units in the pixel array, connected to the photosensitive array, and configured to process a first electric signal obtained through sensing the ambient light by the photosensitive array to obtain a second electric signal.

14. The electronic device according to claim 12, wherein the pixel array comprises:

a first area including a plurality of first pixel units separated by a first gap between adjacent first pixel units; and a second area including a plurality of second pixel units separated by a second gap between adjacent second pixel units, wherein the first gap between the adjacent first pixel units in the first area is greater than the second gap between the adjacent second pixel units in the second area; and wherein the photosensitive array is in the first gap in the first area.

15. The electronic device according to claim 14, wherein the first area is located at one or more edges of the pixel array, and comprises an area where at least two adjacent rows of pixel units are located, or an area where at least two adjacent columns of pixel units are located;

wherein the photosensitive array is located between any two adjacent rows or columns of pixel units in the first area, and a length of the photosensitive array is consistent with a length of the first area.

16. The electronic device according to claim 14, wherein a ratio of the first gap in the first area to the second gap in the second area is in a range of 1.1 to 2.

17. The electronic device according to 12, further comprising:

a transparent cover plate covering the pixel array and the photosensitive array and having a light transmission direction and a light shielding direction;

wherein the light transmission direction is pointed from the transparent cover plate to the photosensitive array, and the light shielding direction is along a connection direction of two adjacent pixel units.

18. The electronic device according to claim 17, wherein a thickness of the transparent cover plate is less than a thickness threshold;

wherein the thickness threshold is a thickness corresponding to a minimum photosensitive angle of the photosensitive array, wherein the photosensitive angle of the photosensitive array is an arctangent value of a ratio of half a width of the photosensitive array to the thickness of the transparent cover plate.

19. The electronic device according to claim 18, wherein the minimum photosensitive angle is a photosensitive angle when a photosensitive power intensity of the photosensitive array is half of a maximum power intensity.

* * * * *